United States Patent
Li et al.

(10) Patent No.: US 9,431,040 B1
(45) Date of Patent: Aug. 30, 2016

(54) MAGNETIC RECORDING TRANSDUCER

(75) Inventors: Guanxiong Li, Fremont, CA (US); Wei Zhang, Fremont, CA (US); Ming Mao, Dublin, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 726 days.

(21) Appl. No.: 13/535,828

(22) Filed: Jun. 28, 2012

Related U.S. Application Data

(62) Division of application No. 12/560,669, filed on Sep. 16, 2009, now Pat. No. 8,233,248.

(51) Int. Cl.
*G11B 5/39* (2006.01)

(52) U.S. Cl.
CPC ............. *G11B 5/398* (2013.01); *G11B 5/3932* (2013.01)

(58) Field of Classification Search
CPC ... G11B 5/398; G11B 5/3932; G11B 5/1663; G11B 5/3169
USPC ............................................. 360/324–324.12
See application file for complete search history.

(56) References Cited

U.S. PATENT DOCUMENTS

| | | | |
|---|---|---|---|
| 5,024,896 A * | 6/1991 | Mathad et al. ............ 428/473.5 |
| 5,780,161 A | 7/1998 | Hsu | |
| 5,994,226 A | 11/1999 | Kadomura | |
| 6,251,545 B1 | 6/2001 | Levinson | |
| 6,385,018 B1 * | 5/2002 | Mukoyama .............. 360/324.12 |
| 6,518,206 B1 | 2/2003 | Kumar et al. | |
| 6,627,355 B2 | 9/2003 | Levinson et al. | |
| 6,667,493 B2 * | 12/2003 | Ooshima ........................ 257/49 |
| 6,692,898 B2 | 2/2004 | Ning | |
| 6,729,014 B2 | 5/2004 | Lin et al. | |
| 6,824,932 B2 | 11/2004 | Bukofsky et al. | |
| 6,861,177 B2 | 3/2005 | Pinarbasi et al. | |
| 6,872,467 B2 | 3/2005 | Qian et al. | |
| 6,983,531 B2 | 1/2006 | Horng et al. | |
| 6,996,894 B2 | 2/2006 | Hsiao et al. | |
| 7,002,781 B2 * | 2/2006 | Sugawara ................ 360/324.11 |
| 7,008,550 B2 | 3/2006 | Li et al. | |
| 7,037,850 B2 | 5/2006 | Lee et al. | |
| 7,070,697 B2 * | 7/2006 | Freitag et al. .................. 216/22 |
| 7,159,304 B2 * | 1/2007 | Arasawa et al. ........... 29/603.16 |
| 7,181,828 B2 | 2/2007 | Yazawa et al. | |
| 7,284,316 B1 * | 10/2007 | Huai et al. ................. 29/603.16 |
| 7,380,332 B2 | 6/2008 | Bedell et al. | |

(Continued)

OTHER PUBLICATIONS

Kautzky et al., "The Application of Collimated Sputtering to Abutted Junction Reader Processing," datatech, pp. 111-117, published under "Other Publications" as cited on U.S. Patent No. 7,070,697 B2, with a patent date of Jul. 4, 2006.*

(Continued)

*Primary Examiner* — Will J Klimowicz

(57) ABSTRACT

A magnetic recording transducer comprises a magnetoresistive sensor having a left side, a right side opposite to the left side, a left junction angle at the left side, a right junction angle at the right side, and a track width. The right junction angle and the left junction angle are characterized by a junction angle difference of not more than six degrees. The track width is less than one hundred nanometers. The magnetic recording transducer further comprises a left hard bias structure residing adjacent to the left side of the magnetoresistive sensor, and a right hard bias structure residing adjacent to the right side of the magnetoresistive sensor.

8 Claims, 14 Drawing Sheets

(56) References Cited

U.S. PATENT DOCUMENTS

| | | | |
|---|---|---|---|
| 7,551,408 B2* | 6/2009 | Shimazawa et al. | 360/324.11 |
| 7,555,828 B2 | 7/2009 | Breyta et al. | |
| 7,562,436 B2 | 7/2009 | Jayasekara | |
| 7,579,282 B2 | 8/2009 | Rauf et al. | |
| 7,605,006 B2* | 10/2009 | Morijiri et al. | 438/3 |
| 7,640,650 B2 | 1/2010 | Araki et al. | |
| 7,771,894 B2 | 8/2010 | Wu | |
| 7,824,562 B2 | 11/2010 | Pelhos | |
| 7,869,166 B2* | 1/2011 | Miyauchi et al. | 360/324.11 |
| 8,091,210 B1 | 1/2012 | Sasaki et al. | |
| 8,225,488 B1 | 7/2012 | Zhang et al. | |
| 8,233,248 B1 | 7/2012 | Li et al. | |
| 8,313,889 B2 | 11/2012 | Yu et al. | |
| 8,394,280 B1 | 3/2013 | Wan et al. | |
| 2002/0007550 A1* | 1/2002 | Shoji | 29/603.07 |
| 2002/0064005 A1* | 5/2002 | Arasawa et al. | 360/324.12 |
| 2002/0071224 A1* | 6/2002 | Tagawa et al. | 360/327.3 |
| 2004/0103524 A1 | 6/2004 | Breyta et al. | |
| 2004/0145836 A1* | 7/2004 | Kojima et al. | 360/324.12 |
| 2004/0229430 A1 | 11/2004 | Findeis et al. | |
| 2006/0234483 A1 | 10/2006 | Araki et al. | |
| 2007/0023916 A1 | 2/2007 | Hah et al. | |
| 2007/0026538 A1 | 2/2007 | Jayasekara | |
| 2007/0242396 A1* | 10/2007 | Shimazawa et al. | 360/324.12 |
| 2008/0007877 A1* | 1/2008 | Takashita et al. | 360/324.12 |
| 2008/0008955 A1 | 1/2008 | Brodsky et al. | |
| 2009/0139958 A1 | 6/2009 | Pentek et al. | |
| 2009/0200264 A1 | 8/2009 | Cyrille et al. | |
| 2010/0308012 A1 | 12/2010 | Yamamoto | |
| 2011/0032645 A1 | 2/2011 | Noel et al. | |
| 2011/0198314 A1 | 8/2011 | Wang et al. | |
| 2012/0298621 A1 | 11/2012 | Gao | |

OTHER PUBLICATIONS

Notice of Allowance dated Apr. 12, 2012 from U.S. Appl. No. 12/560,669, 13 pages.

\* cited by examiner

MAGNETIC RECORDING TRANSDUCER

CROSS REFERENCE TO RELATED APPLICATIONS

This application is a divisional of U.S. patent application Ser. No. 12/560,669, filed on Sep. 16, 2009, now U.S. Pat. No. 8,233,248, which is hereby incorporated by reference in its entirety.

BACKGROUND

FIG. 1 depicts a conventional method 10 for fabricating a magnetoresistive sensor in magnetic recording technology applications. FIGS. 2-3 depict a conventional transducer 50 during fabrication using the method 10. The method 10 typically commences after a conventional magnetoresistive, or MR, stack has been deposited. The conventional magnetoresistive stack typically includes an antiferromagnetic (AFM) layer, a pinned layer, a nonmagnetic spacer layer, and a free layer. In addition, seed and/or capping layers may be used. The pinned layer may be a synthetic antiferromagnetic (SAF) layer including magnetically coupled ferromagnetic layers separated by a nonmagnetic spacer layer. The nonmagnetic spacer layer may be a conductive layer for a giant magnetoresistive sensor or an insulator for a tunneling magnetoresistive sensor. The free layer is ferromagnetic and has a magnetization that is free to change in response to an external magnetic field, for example from a media.

The conventional method 10 commences providing a conventional organic mask, via step 12. The conventional organic mask provided in step 12 is typically a photoresist mask. The conventional photoresist mask covers the region from which the conventional magnetoresistive sensor is to be formed, as well as the field region of the transducer 50. However, part of the device region adjoining the magnetoresistive sensor is left uncovered. The magnetoresistive sensor is defined, via step 14. Step 14 typically includes ion milling the transducer 50. Thus, the portion of the magnetoresistive stack exposed by the conventional photoresist mask is removed. FIG. 2 depicts air-bearing surface (ABS) and plan views of a conventional, magnetic recording read transducer 50 after step 14 is completed. For clarity, FIG. 2 is not drawn to scale and only certain structures are depicted. The conventional transducer 50 magnetoresistive layers 54 which have been defined to provide a conventional magnetoresistive sensor 56. Because the regions adjacent to the conventional magnetoresistive sensor 56 were exposed, the conventional magnetoresistive sensor 56 has been formed. Also shown is conventional photoresist mask 58 which has a first portion 62 covering the magnetoresistive sensor 56 and remaining portions 60 that cover the remaining device and field regions. The photoresist mask 58 used is typically very thick. For example, the photoresist mask may be on the order of one hundred sixty nanometers or higher.

The hard bias material(s) are deposited, via step 16. In addition, seed and/or capping layers may be provided in step 16. The hard bias material(s) and other layers are deposited while the conventional photoresist mask 58 is in place. A lift-off of the conventional photoresist mask 58 is then performed, via step 18. FIG. 3 depicts the conventional transducer 50 after step 18 is performed. Thus, the hard bias material(s) 64 are shown. The hard bias material(s) to the left are denoted 64L, while the hard bias material(s) to the right of the magnetoresistive sensor 56 are denoted 64R. Fabrication of the conventional transducer 50 may be completed.

Although the conventional method 10 allows the conventional transducer 50 to be fabricated, there are several drawbacks. In particular, there may be asymmetries in the conventional transducer 50. As can be seen in FIGS. 2-3, the conventional magnetoresistive sensor 56 is asymmetric. These asymmetries may become significant at smaller track widths, for example thirty to forty nanometers or less. In particular, the junction angles θ and φ may differ significantly. Further, multiple transducers 50 are typically fabricated from a single wafer. There may also be variations in the junction angles between transducers 50 fabricated on the same wafer. Transducers closer to the center may have a smaller variation in junction angles than transducer 50 closer to the edge. For conventional transducers 50, the average difference between the left junction angle φ and the right junction angle θ may be seven or more degrees. Further, as can be seen in FIG. 3, the hard bias 64L and 64R are asymmetric. Again, this asymmetry may vary across a wafer. These variations between conventional transducers 50 may adversely affect performance and/or yield.

Accordingly, what is needed is a system and method for improving the fabrication of a magnetic recording read transducer.

BRIEF SUMMARY OF THE INVENTION

A method and system for fabricating a magnetic transducer is described. The transducer has a device region, a field region, and a magnetoresistive stack. The method and system include providing a hard mask on the magnetoresistive stack. The hard mask is an inorganic mask and includes a sensor portion and a line frame. The sensor portion covers a first portion of the magnetoresistive stack corresponding to a magnetoresistive structure. The line frame covers a second portion of the magnetoresistive stack in the device region. The method and system also include defining the magnetoresistive structure in a track width direction using the hard mask and providing at least one hard bias material after the magnetoresistive structure is defined. A first portion of the at least one hard bias material is substantially adjacent to the magnetoresistive structure in the track width direction. The method and system also include removing a second portion of the at least one hard bias material. In one aspect, the magnetoresistive structure is characterized by a junction angle difference between junction angles on opposing sides of the magnetoresistive structure, In such an aspect, the average junction angle difference does not exceed six degrees. In addition, the track width in this aspect is less than or equal to one hundred nanometers.

DETAILED DESCRIPTION OF THE PREFERRED EMBODIMENTS

Figure 4:
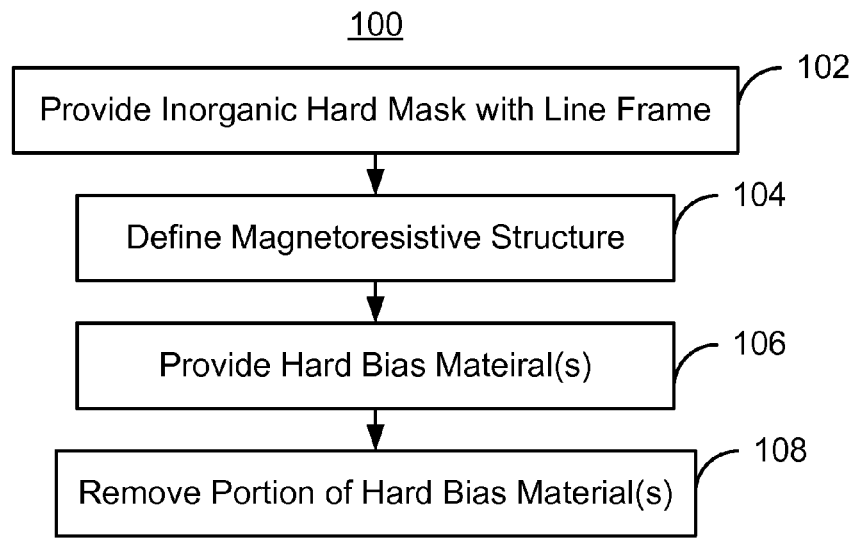
FIG. 4 is a flow chart depicting an exemplary embodiment of a method for fabricating a magnetic recording transducer.

FIG. 4 is an exemplary embodiment of a method 100 for providing magnetic recording transducer. For simplicity, some steps may be omitted. The method 100 is also described in the context of providing a single recording transducer. However, the method 100 may be used to fabricate multiple transducers at substantially the same time. The method 100 is also described in the context of particular layers. A particular layer may include multiple materials and/or multiple sub-layers. The method 100 also may start after formation of other portions of the magnetic recording transducer. For example, the method 100 commences after deposition of magnetoresistive layer(s) for a magnetoresistive stack. The magnetoresistive layers may includes a pinning layer, a pinned layer, a nonmagnetic spacer layer, and a free layer. In addition, seed and/or capping layers may be used. The pinning layer may be an AFM or other layer configured to fix, or pin, the magnetization of the pinned layer. The pinned layer may be a synthetic antiferromagnetic (SAF) layer including magnetically coupled ferromagnetic layers separated by a nonmagnetic layer. The ferromagnetic layers may be termed pinned and reference sub-layers. The nonmagnetic spacer layer may be a conductive layer for a giant magnetoresistive structure, an insulator for a tunneling magnetoresistive structure, or may have another structure. The free layer is ferromagnetic and has a magnetization that is free to change in response to an external magnetic field, for example from a media. The free layer may have multiple sub-layers, as may the pinned and reference sub-layers. Further, the transducer may be considered to have a device region, in which the magnetoresistive structure is to be formed, and a field region distal from the magnetoresistive structure.

A hard mask is provided on the magnetoresistive stack, via step 102. The hard mask is inorganic and includes a structure portion and a line frame. In some embodiments, for example in which the structure is a magnetoresistive sensor, the structure portion of the hard mask may also be termed a sensor portion. The structure portion of the hard mask covers a part of the magnetoresistive stack corresponding to the magnetoresistive structure being formed. The line frame covers a second portion of the magnetoresistive stack in the device region. In some embodiments, the line frame may be significantly wider than the sensor portion. For example, the line frame may have a width on the order of at least two hundred nanometers, while the structure portion has a width on the order of sixty nanometers or less. In some embodiments, the width of the sensor portion may be thirty to forty nanometers or less. Step 102 may include depositing a hard mask layer, then patterning the hard mask layer to form the hard mask. The hard mask provided in step 102 should be resistant to removal in the process used to define the magnetoresistive structure in step 104, described below. For example, in some embodiments, the hard mask includes one or more of diamond-like carbon (DLC), SiC, and SiN. Further, the hard mask may be relatively thin. In one embodiment, the hard mask has a thickness of not more than seventy nanometers. In one such embodiment, the hard mask has a thickness of not more than sixty nanometers. In some embodiments, the hard mask is also configured to provide a magnetoresistive structure having a small width of not more than one hundred nanometers. In some such embodiments, the width may be smaller, for example not more than sixty nanometers. In some embodiments, the width may be thirty to forty nanometers or less.

The magnetoresistive structure is defined at least in a track width direction using the hard mask, via step 104. In one embodiment, step 104 includes performing an ion mill to remove exposed portions of the magnetoresistive stack.

One or more hard bias materials are provided after the magnetoresistive structure is defined, via step 106. Thus, a portion of the hard bias material(s) is substantially adjacent to the magnetoresistive structure in the track width direction. If the magnetoresistive structure is to be used in a current-perpendicular-to-plane (CPP) configuration, then an insulator might be provided prior to the hard bias material(s) in step 106. In addition, seed and/or capping layers may also be provided in step 106. For example, the capping layer(s) may include a trilayer having Ru sub-layer sandwiched between Ta layers.

A portion of the hard bias material(s) is removed in step 108. Step 108 includes removing the hard bias materials at least in the field region of the magnetic recording transducer. In such an embodiment, the device region of the transducer may be covered, for example by an organic mask. The hard bias material(s) in the exposed, field regions may then be removed. In addition, step 108 may include removing any hard bias material(s) residing on the magnetoresistive structure. Further, portions of the hard mask may also be removed, for example using a reactive ion etch having the appropriate chemistry. Fabrication of the transducer may then be completed.

Figure 5:
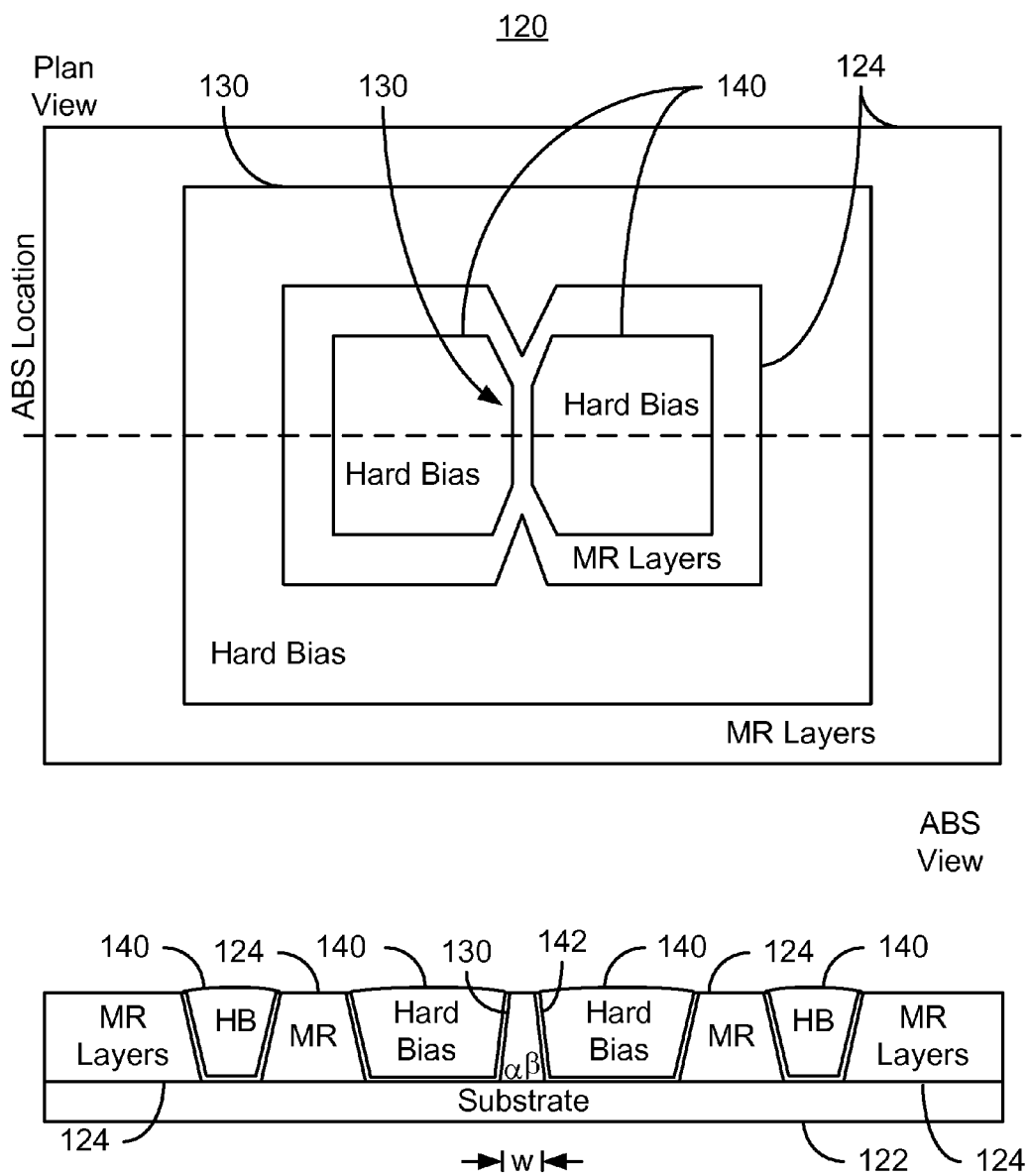
FIG. 5 depicts plan and ABS views of an exemplary embodiment of a magnetic recording transducer.

FIG. 5 depicts plan and ABS views of an exemplary embodiment of a magnetic recording transducer 120 fabricated using the method 100. For clarity, FIG. 5 is not drawn to scale. Further, although described in the context of layers, structures in the magnetic recording transducer 120 may include one or more sub-layers. For simplicity, only portions of the transducer 120 are shown. In some embodiments, the transducer 120 may be part of a head. The head may be a merged head including at least one write transducer (not shown) in addition to at least one read transducer 120. Further, the head may reside on a slider (not shown) and be part of a disk drive including the head, slider and media (not shown) on which data is written.

The transducer 120 includes a substrate 122 and magnetoresistive layers 124 defined from a magnetoresistive stack. In addition, the transducer 120 includes magnetoresistive structure 130 and hard bias structures 140. The magnetoresistive structure 130 is a read sensor. The MR layers 124 and read sensor 130 may be deposited as a full film. The read sensor 130 is then defined using step 104. The hard bias 130 may be provided as a full film. However, because the hard mask and/or other structures may be removed during fabrication, the hard bias 140 adjacent to the magnetoresistive structure 130 and magnetoresistive layers 124 remains. In the embodiment shown, the magnetoresistive sensor 130 is to be used in a CPP configuration. Consequently, an insulating layer 142 is also provided between the hard bias material(s) 140 and the magnetoresistive sensor 130.

The magnetoresistive sensor 130 has a track width, w. The track width corresponds to a characteristic distance between the right and left sides. In some embodiments, the magnetoresistive sensor 130 has a track width of not more than one hundred nanometers. In some embodiments, the track width may be smaller. For example, in one embodiment, the track width, w, is not more than sixty nanometers. In other embodiments, w is not more than thirty to forty nanometers.

The magnetoresistive sensor 130 had has a left side having a junction angle α and a right side having a junction angle β. The junction angles for the magnetoresistive sensor 130 and others formed in a similar manner may be characterized by an average junction angle difference. The average junction angle difference is the average of the differences between the junction angles α and β for a number of transducers 120. The average junction angle difference being not more than six degrees. In some embodiments, the average junction angle difference is not more than four degrees. In another embodiment, the average junction angle difference is not more than three degrees. In yet another embodiment, the average junction angle difference is not more than two degrees.

Figure 1:
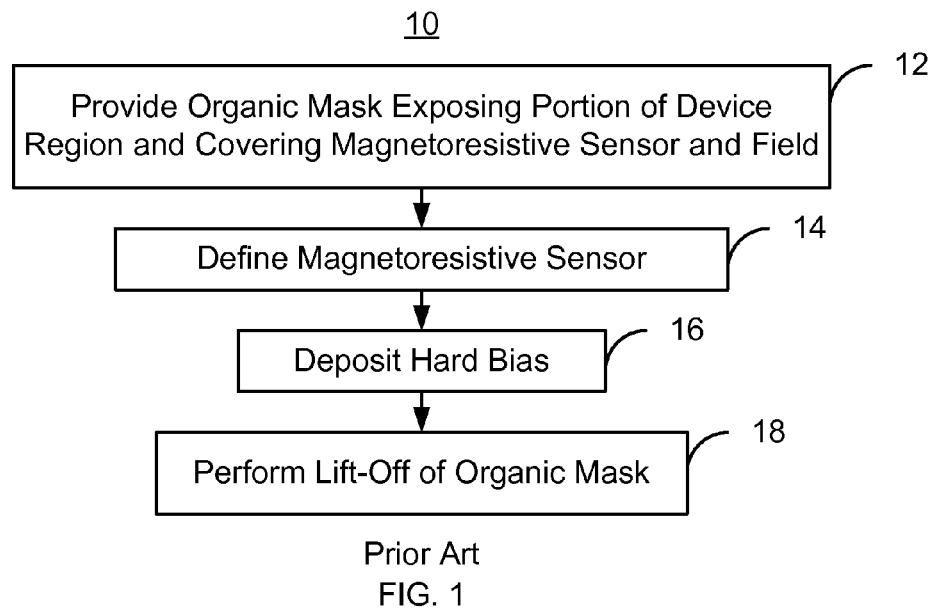
FIG. 1 is a flow chart depicting a conventional method for fabricating a magnetic recording transducer.
Figure 2:
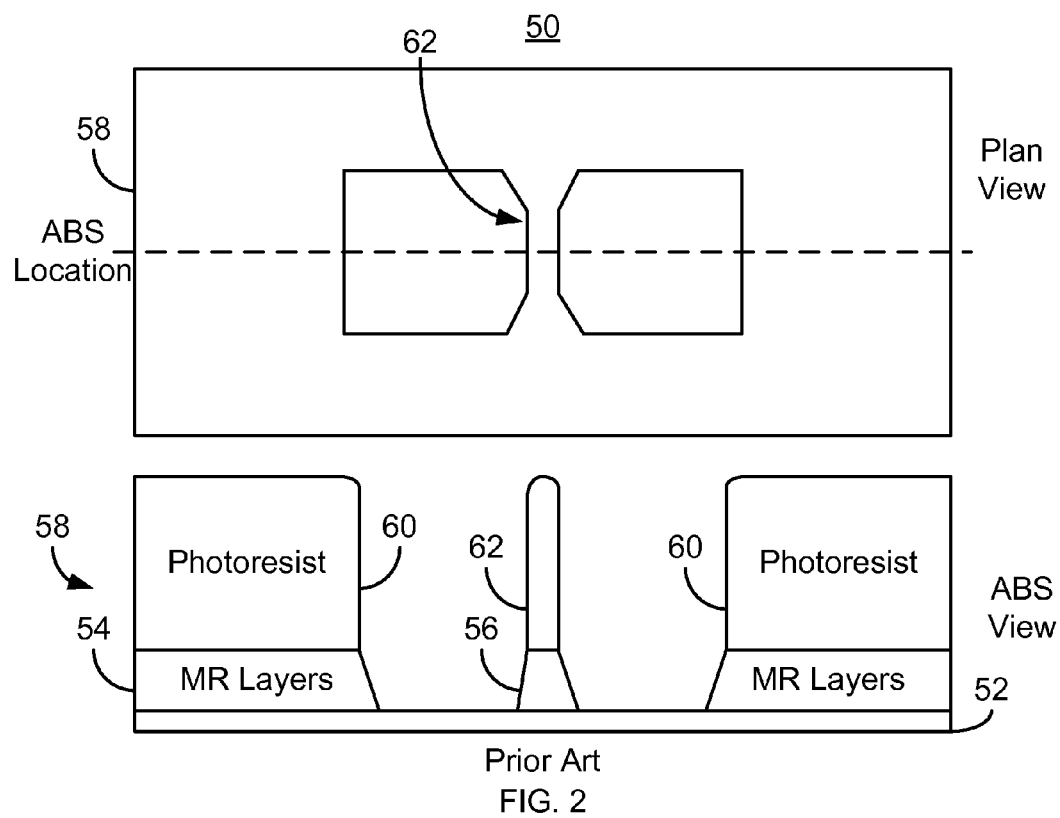
FIG. 2 depicts plan and ABS views of a conventional magnetic recording transducer during fabrication.
Figure 3:
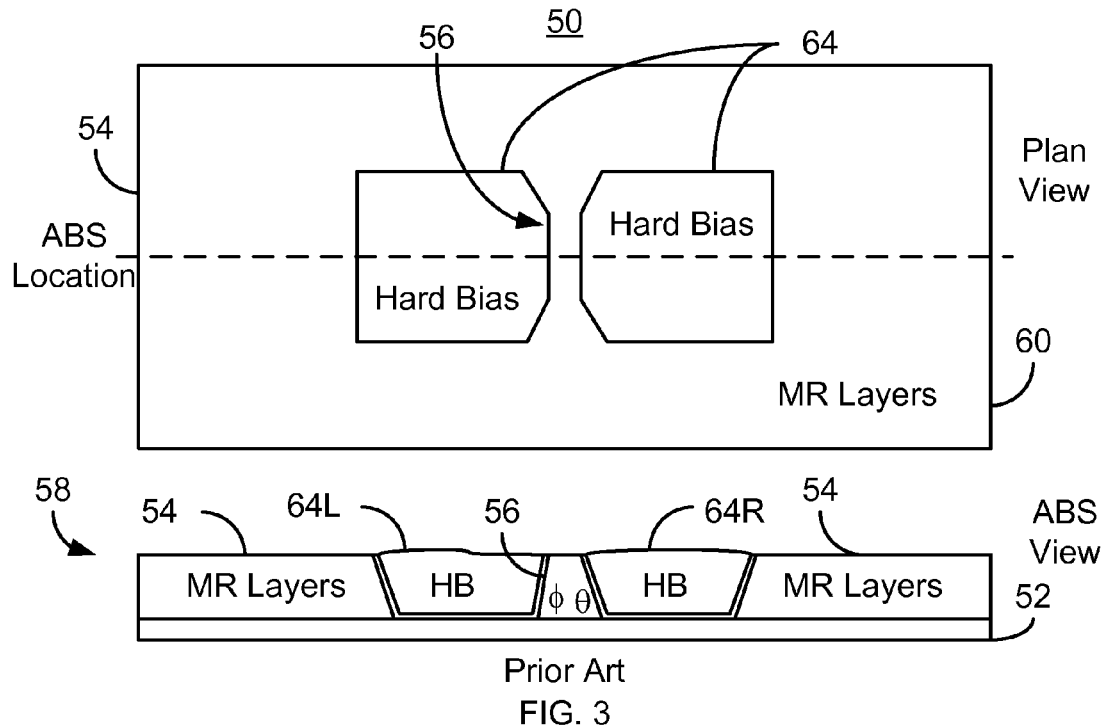
FIG. 3 depicts plan and ABS views of a conventional magnetic recording transducer during fabrication.

Using the method 100, the transducer 120 may be formed. As discussed above, the transducer 120 is symmetric. Thus, the junction angles α and β may be closer in size. In particular, it has been determined that asymmetries in the portion 62 of the thick photoresist mask 58 shown in FIG. 2 may result in the asymmetries in the conventional sensor 56 and hard bias 64. More specifically, it has been determined that variations in the junction angles may be due to the directional nature of the ion beam used in defining the conventional sensor 56, the large height of the photoresist mask 58, and the asymmetric shape of the top of the portion 62 of the photoresist mask. In contrast, the hard mask provided in step 102 is thinner, and remains substantially unchanged and substantially symmetric. Thus, use of the hard mask in steps 102 and 104 may improve the symmetry of the magnetoresistive sensor 130. The junction angles α and β may, therefore, be significantly more symmetric. In other words, the difference between the junction angles, as well as the average junction angle difference across multiple transducers 120, may be reduced. Further, the thicknesses of the hard bias material(s) 140 adjacent to the left and right sides of the sensor 130 may be more symmetric. Consequently, asymmetries in the transducer 120 may be reduced. In addition, because a line frame is used, removal of a portion of the hard bias may be facilitated. Thus, performance of the transducer 120 and yield using the method 100 may be improved.

Figure 6:
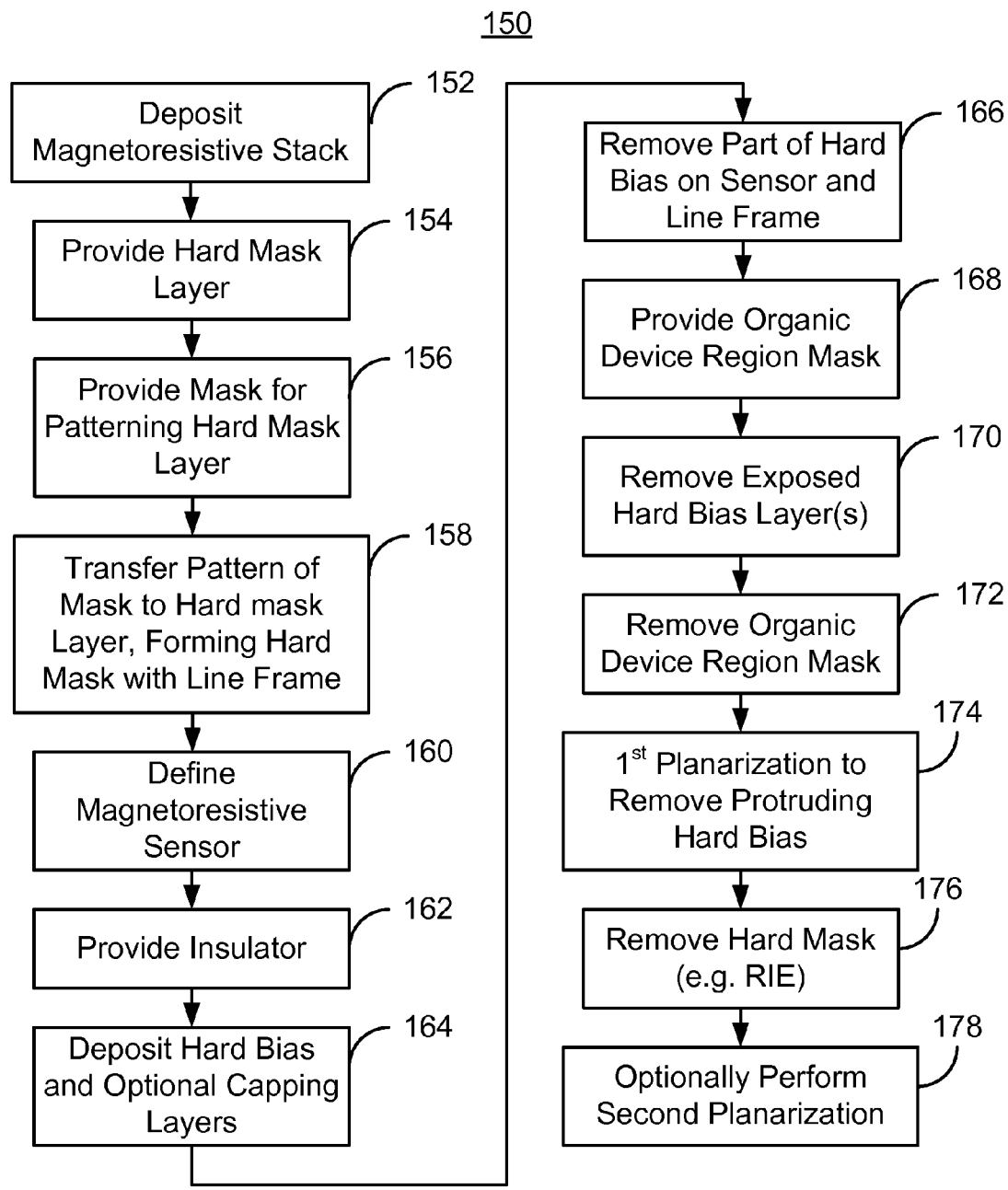
FIG. 6 is a flow chart depicting another exemplary embodiment of a method for fabricating a magnetic recording transducer.

FIG. 6 is a flow chart depicting another exemplary embodiment of a method 150 for fabricating a magnetic recording transducer. FIGS. 7-16 depict plan and ABS view of another exemplary embodiment of a magnetic recording transducer 200 during fabrication. The method 150 is described in the context of the transducer 200. For simplicity, some steps of the method 150 may be omitted. The method 150 is also described in the context of providing a single recording transducer 200. However, the method 150 may be used to fabricate multiple transducers at substantially the same time. The method 150 and transducer 200 are also described in the context of particular layers. A particular layer may include multiple materials and/or multiple sublayers. The method 150 also may start after formation of other portions of the magnetic recording transducer 200.

A magnetoresistive stack is deposited, via step 152. The magnetoresistive layers may includes a pinning layer, a pinned layer, a nonmagnetic spacer layer, and a free layer. In addition, seed and/or capping layers may be used. Examples of such layers are described above. Further, the transducer may be considered to have a device region, in which the magnetoresistive structure is to be formed, and a field region distal from the magnetoresistive structure.

A hard mask layer is provided on the magnetoresistive stack, via step 154. Step 154 includes blanket depositing an inorganic hard mask layer, such as DLC, SiN, and/or SiC on the magnetoresistive stack. In one embodiment, step 154 includes depositing a hard mask layer having a thickness of not more than seventy nanometers. In another embodiment, the hard mask layer provided in step 154 has a thickness of not more than sixty nanometers.

Figure 7:
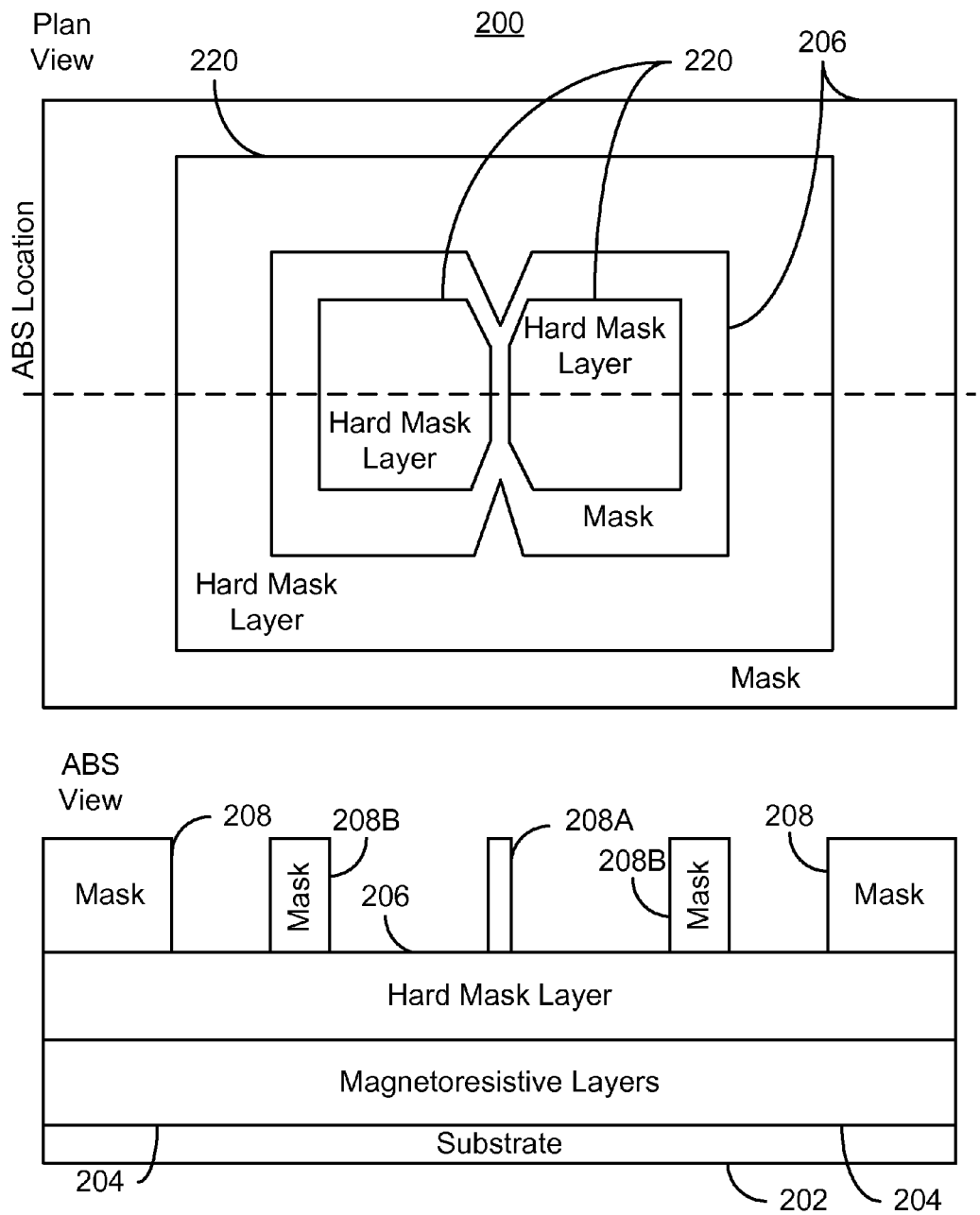
FIGS. 7-16 depict plan and ABS view of another exemplary embodiment of a magnetic recording transducer during fabrication.

A photoresist mask is provided, via step 156. The photoresist mask is used in patterning the hard mask layer to form the hard mask. Thus, the photoresist mask covers a first portion of the hard mask layer corresponding to the sensor portion of the hard mask and a second portion corresponding to the line frame of the hard mask. FIG. 7 depicts the transducer 200 after step 156 is performed. Thus, a substrate 202 and magnetoresistive stack 204 are shown. In addition, the hard mask layer 206 is shown as being blanket deposited on the magnetoresistive stack. Further, the photoresist mask 208 is also shown. The photoresist mask 208 has portions 208A and 208B corresponding to the magnetoresistive structure and the line frame, respectively. The portion 208A corresponding to the magnetoresistive sensor may be printed with a critical dimension at the limit of the photo process used for the photoresist mask 208. However, the width of the line frame may be larger, for example on the order of two hundred nanometers or more.

Figure 8:
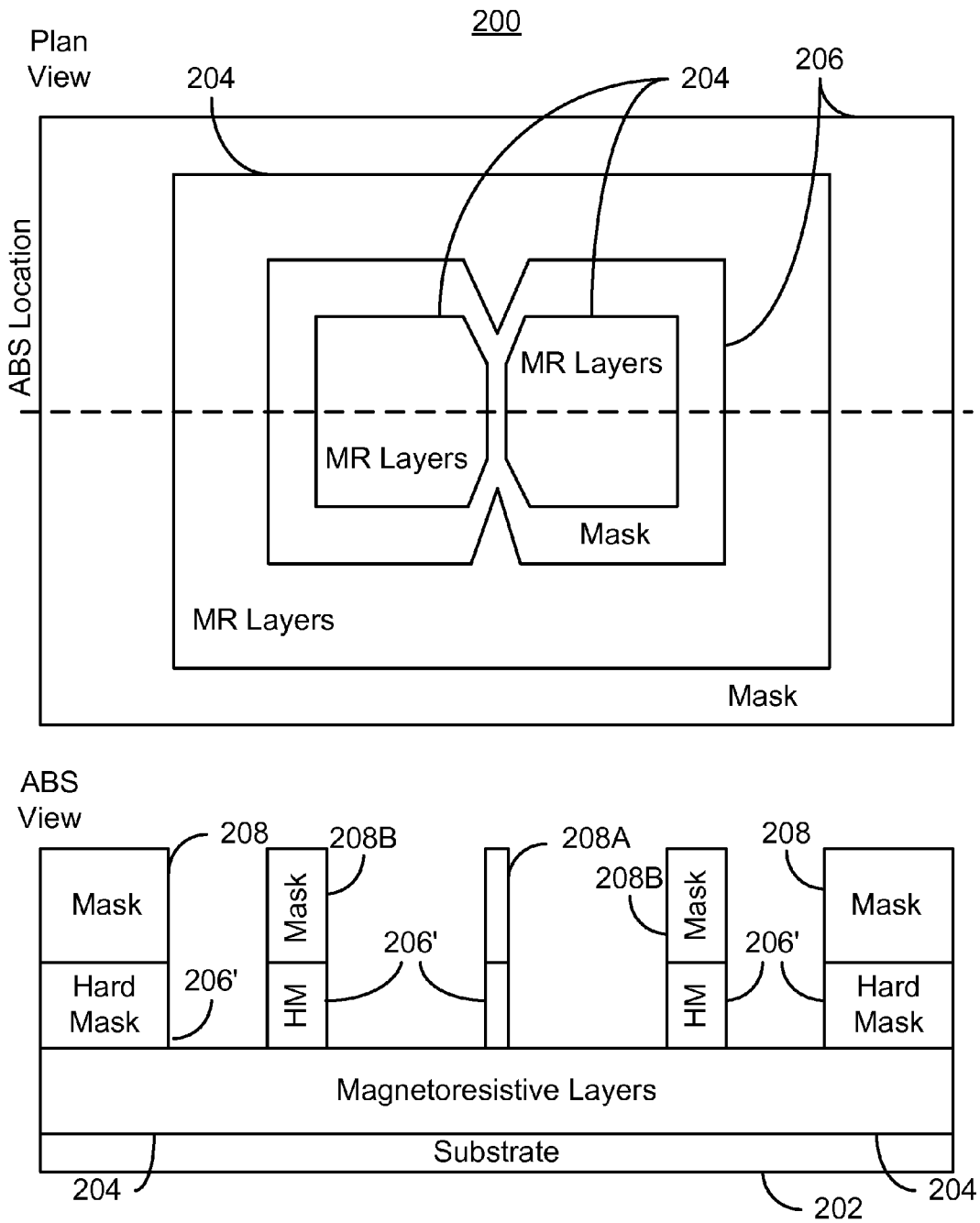

A portion of the hard mask layer is removed to form the hard mask, via step 158. Thus, the pattern of the mask 208 is transferred to the hard mask layer 206. In one embodiment, step 158 is performed using a reactive ion etch (RIE). FIG. 8 depicts the transducer 200 after step 158 is performed. Thus, a hard mask 206' has been formed. The hard mask 206' corresponds to the locations of portions of the mask 208. The portion of the hard mask 206' under the mask portion 208A corresponds to the sensor in the device region. The portion of the hard mask 206' under the mask portion 208B corresponds to the line frame. Also in step 208, the photoresist 165 may be removed, for example via a photoresist strip. Thus, through steps 154-158, the hard mask 206' is provided.

Figure 9:
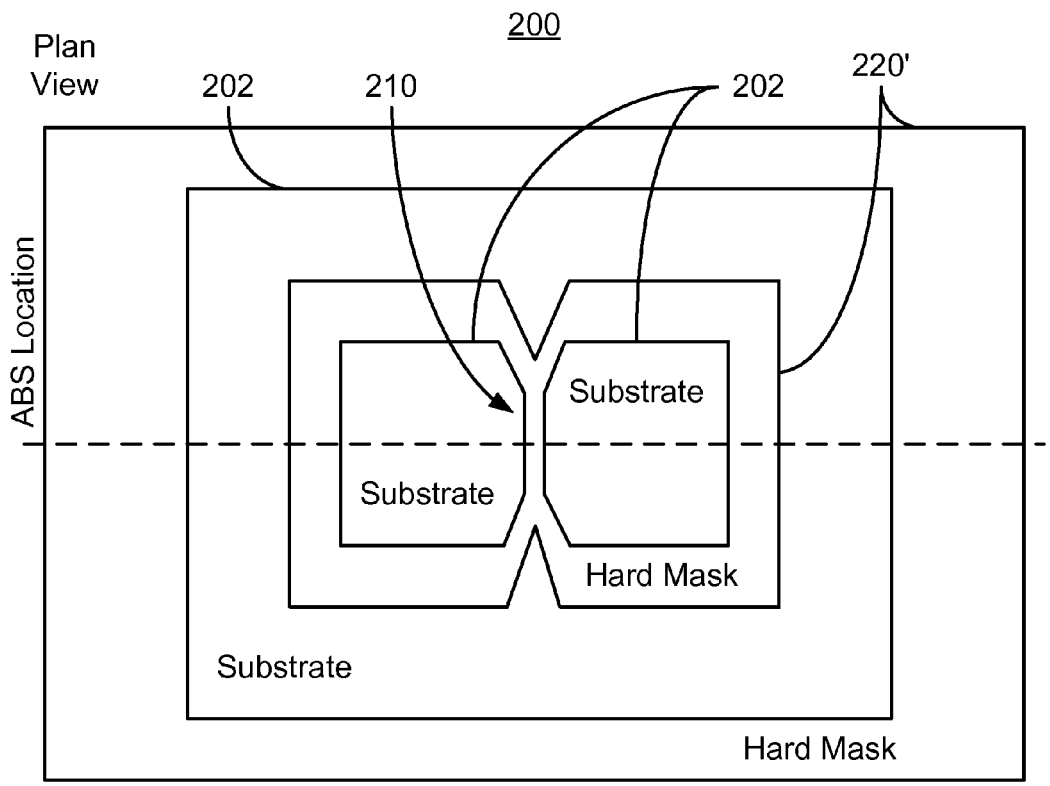
Figure 9:
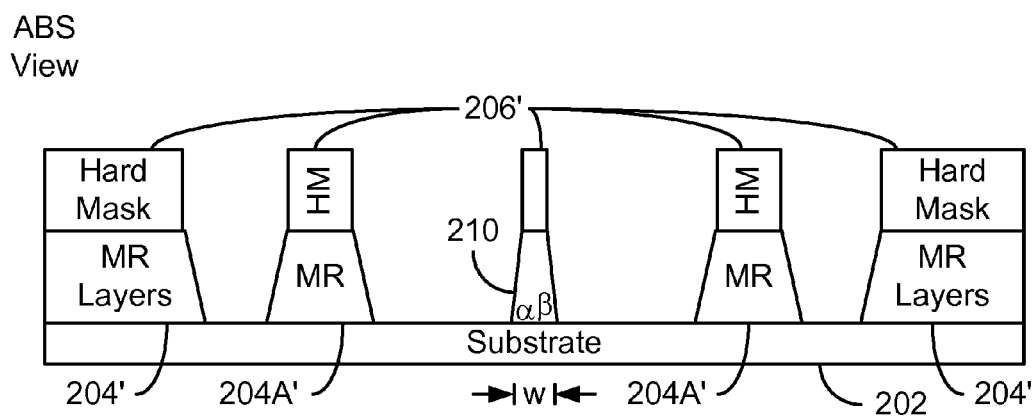

The magnetoresistive structure is defined in the track width direction, via step 160. In step 160, the hard mask 206' is used to protect portions of the magnetoresistive stack 204 from the process. In one embodiment, defining the magnetoresistive structure in a track width direction includes performing an ion mill. FIG. 9 depicts the transducer 200 after step 160 is performed. Thus, a magnetoresistive structure 210 has been defined. In one embodiment, the structure, magnetoresistive layers 204A' corresponding to the line frame of the hard mask have been defined from the magnetoresistive stack 204. In addition, magnetoresistive layers 204' in the field region have also been defined. The sensor 210 has a track width of not more than one hundred nanometers. In other embodiments, the track width may be smaller. For example, in one embodiment, the track width, w, is not more than sixty nanometers. In other embodiments, w is not more than thirty to forty nanometers. In contrast, the width of portions 204A' may be larger as these portions correspond to the line frame. In some embodiments, the portions 204A' may be two hundred nanometers or more in width.

Figure 10:
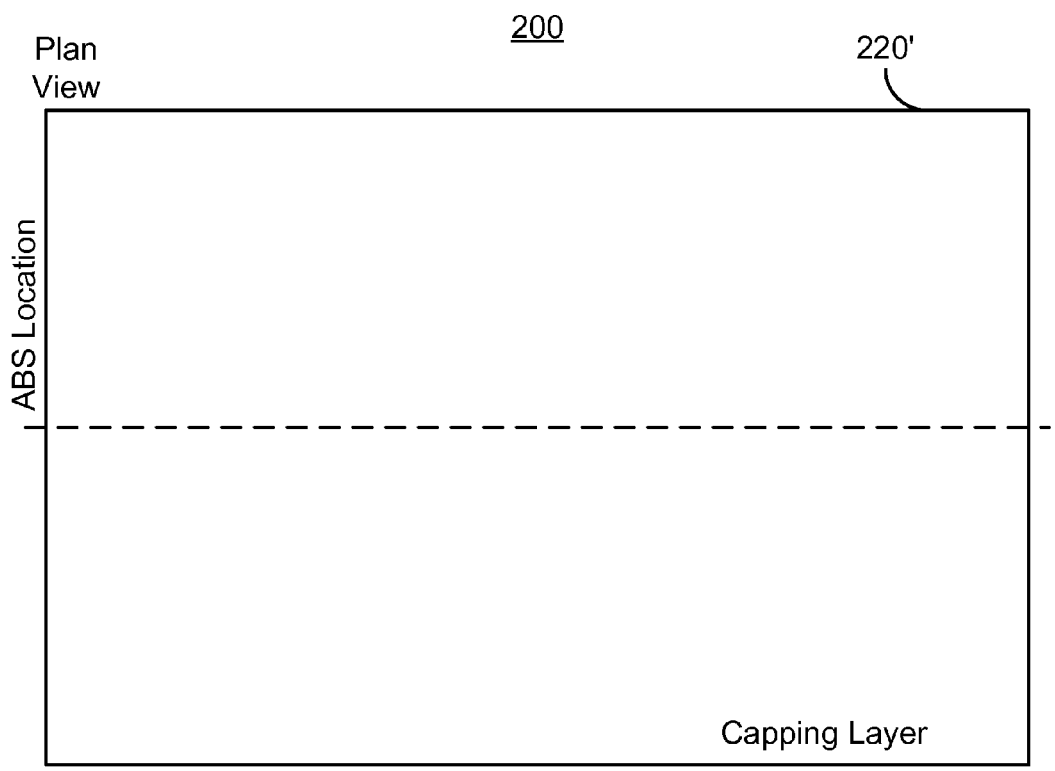
Figure 10:
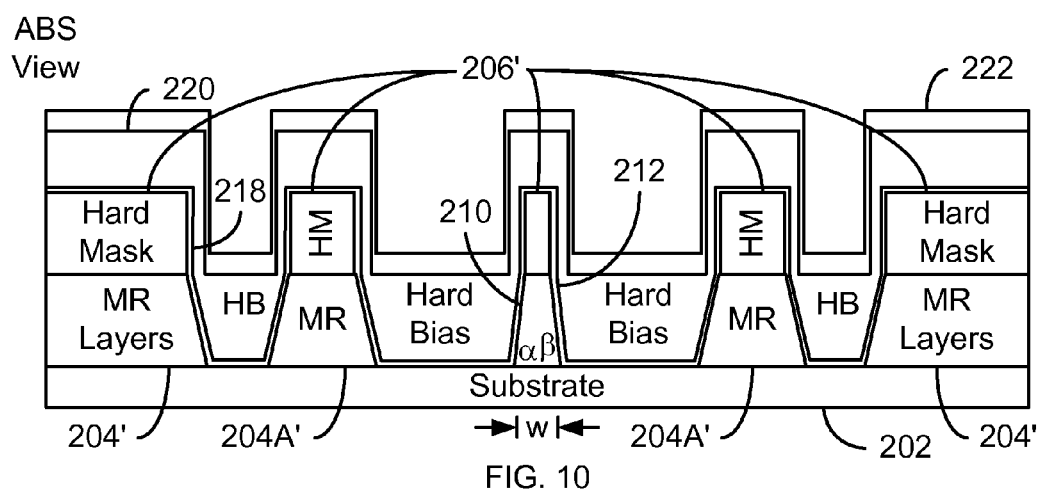

An insulator is optionally provided after the magnetoresistive structure 210 is defined, via step 162. Step 162 is performed if the sensor 210 is to be used in a CPP configuration. At least one hard bias material after the insulator is provided, via step 164. A first portion of the hard bias material(s) is substantially adjacent to the magnetoresistive structure in the track width direction. In some embodiments, capping layer(s) for the hard bias material(s) may also be provided in step 164. In some embodiments, the capping layer may have sub-layer(s). For example, providing a plurality of sub-layers may include providing a first Ta sub-layer, a Ru sub-layer, and a second Ta sub-layer. In such an embodiment, the Ru sub-layer resides between the Ta sub-layers. FIG. 10 depicts the transducer 200 after step 164 is performed. Thus, hard bias layer 220 and capping layer(s) 222 are shown.

Figure 11:
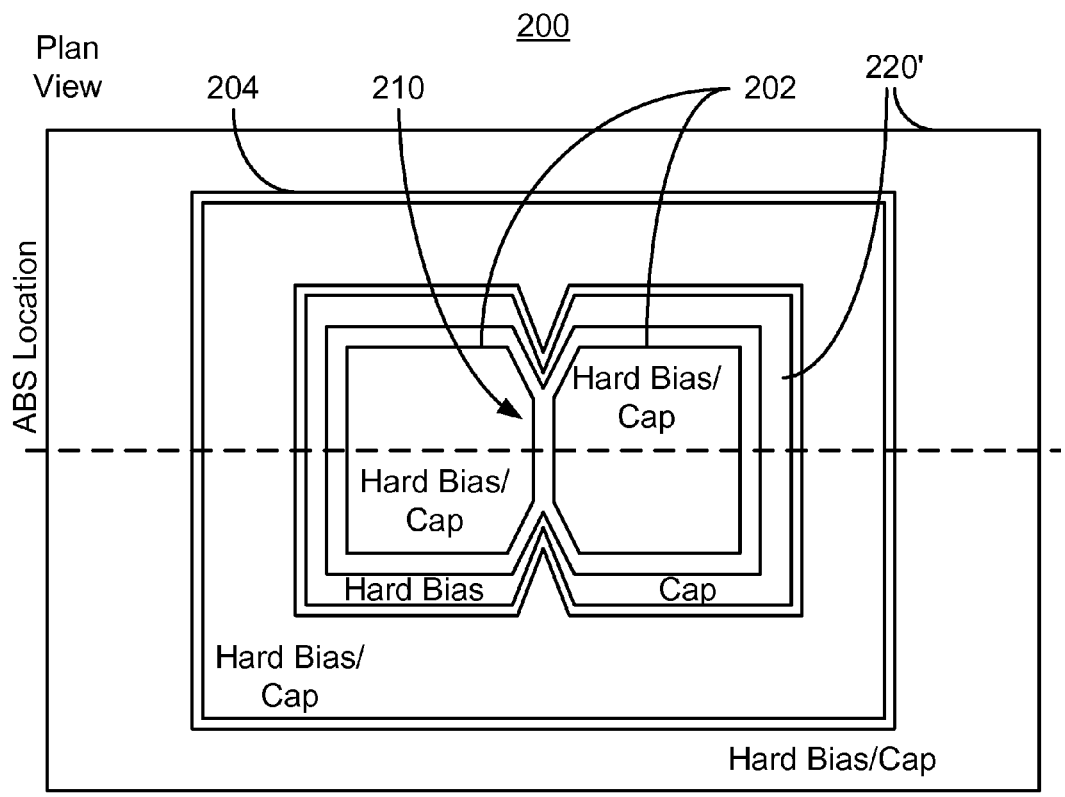
Figure 11:
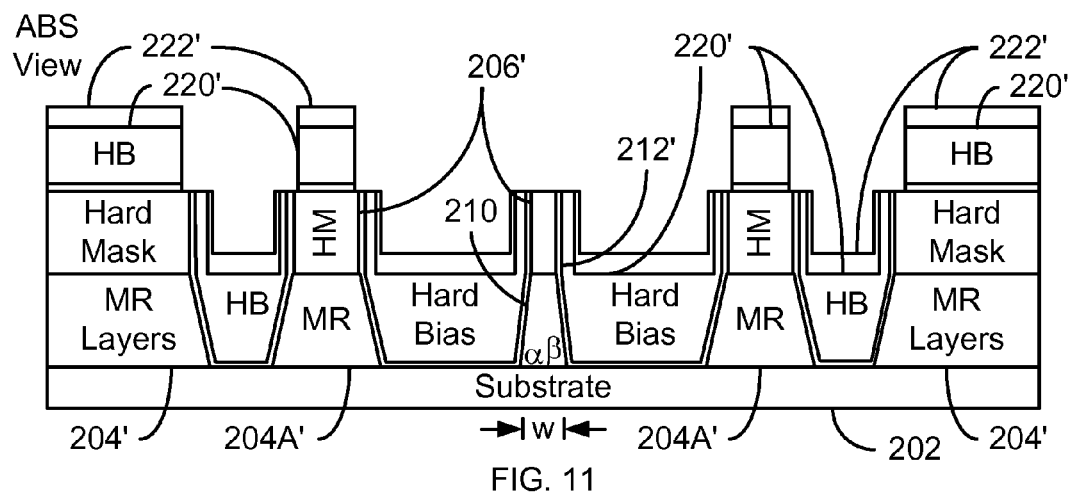

A portion of the hard bias material(s) 220 is removed, via step 166. The portion removed resides on the hard mask 206' above the sensor 210 and the line frame 204A', Step 166 may include performing a high angle ion mill, for example at an angle of sixty or more degrees from normal to the surface of the transducer 200. FIG. 11 depicts the transducer 200 after step 166 is performed. The portions of the hard bias material(s) 220 and capping layer(s) 222 on the hard mask 206' are shrunk. Thus, the hard bias 220' and capping layers 222' are shown. In some embodiments, the portion of the hard bias material(s) 220 above the magnetoresistive structure 210 is completely removed. This situation is shown in FIG. 11. However, in other embodiments, some portion of the hard bias material(s) 220 on the sensor 210 remain.

Figure 12:
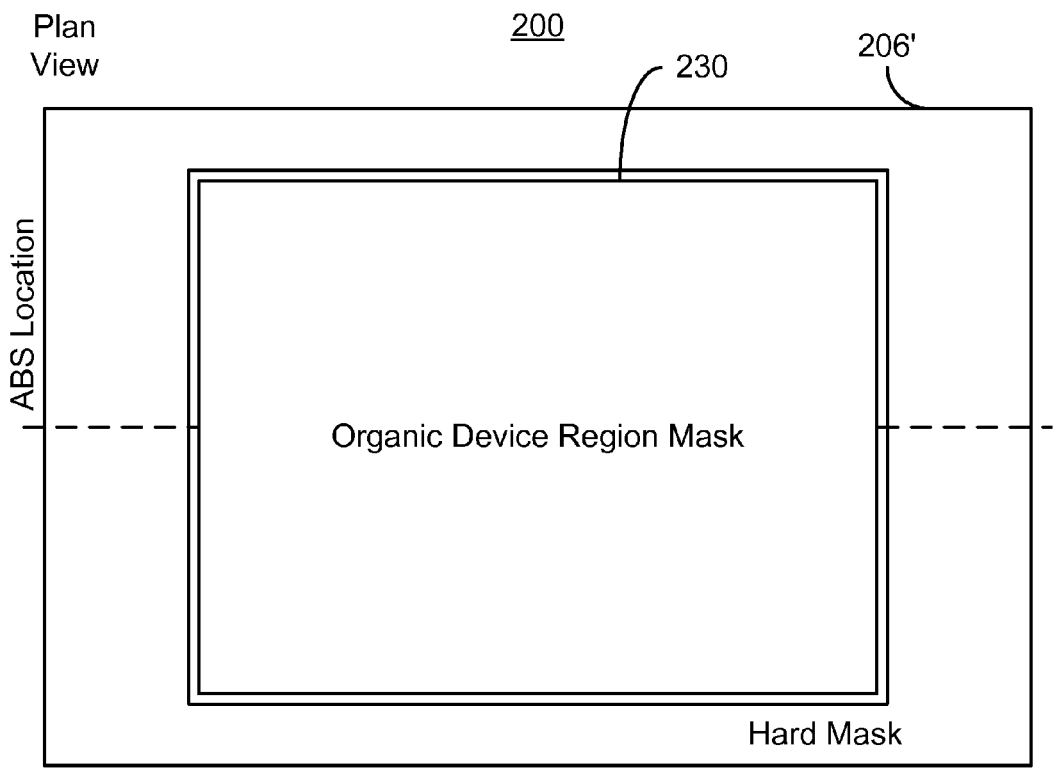
Figure 12:
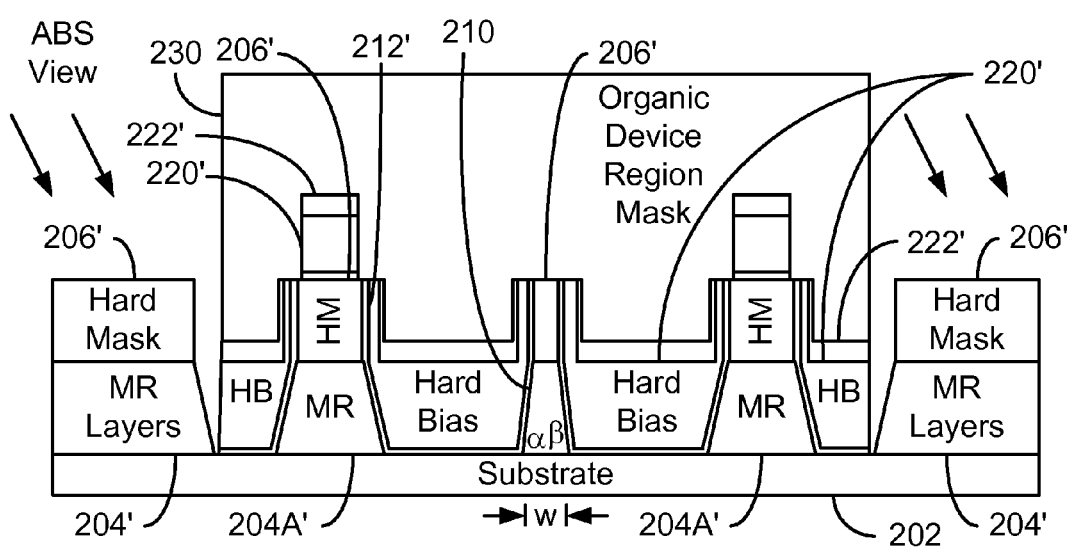

An organic device region mask is provided after the portion of the hard bias material(s) is removed, via step 168. Step 168 may include spinning on a layer of photoresist, then patterning the photoresist using photolithography. The organic device region mask covers at least the device region and leaves at least a portion of the field region uncovered. An exposed portion of the hard bias material(s) is removed while the organic device region mask remains in place, via step 170. Thus, exposed hard bias in the field region may be removed. In one embodiment, step 170 may be performed using an ion mill. FIG. 12 depicts the transducer 200 after step 170 is performed. Thus, the device region mask 230 is shown. The organic device region mask 230 covers most the device region of the transducer 200, but leaves the field region exposed. In addition, the exposed portion of the hard bias material(s) 220' and capping material(s) 222' in the field region have been removed. Thus, hard mask 206' in the field region is exposed.

Figure 13:
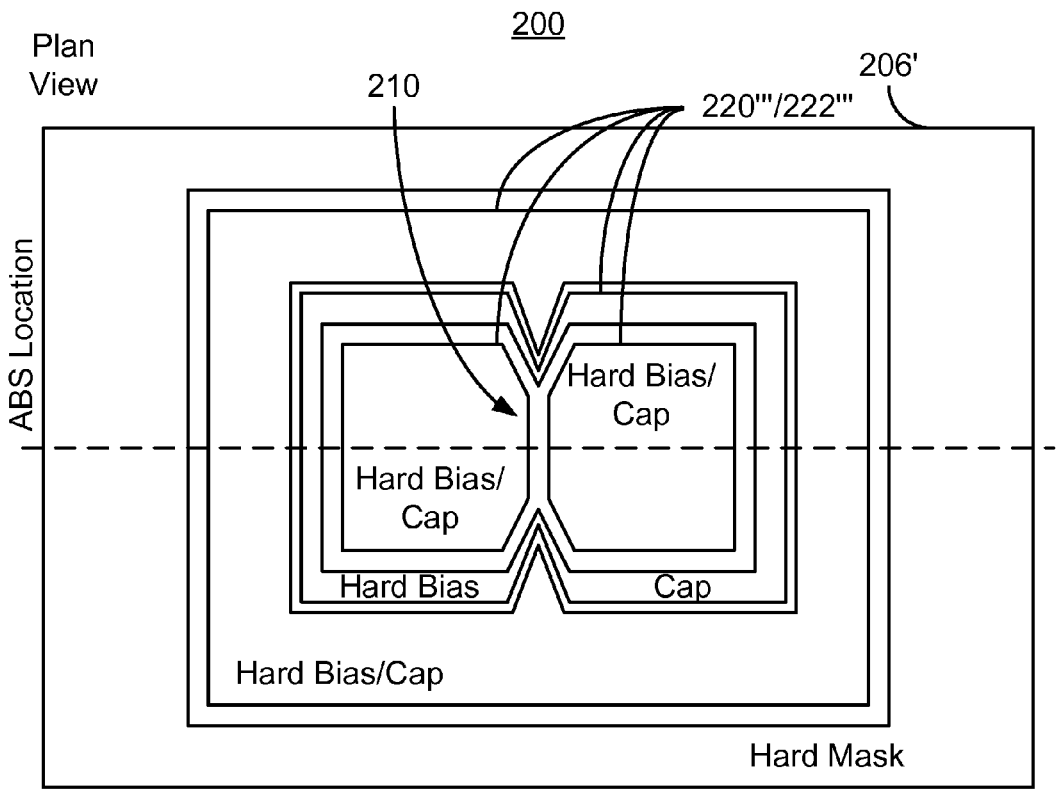
Figure 13:
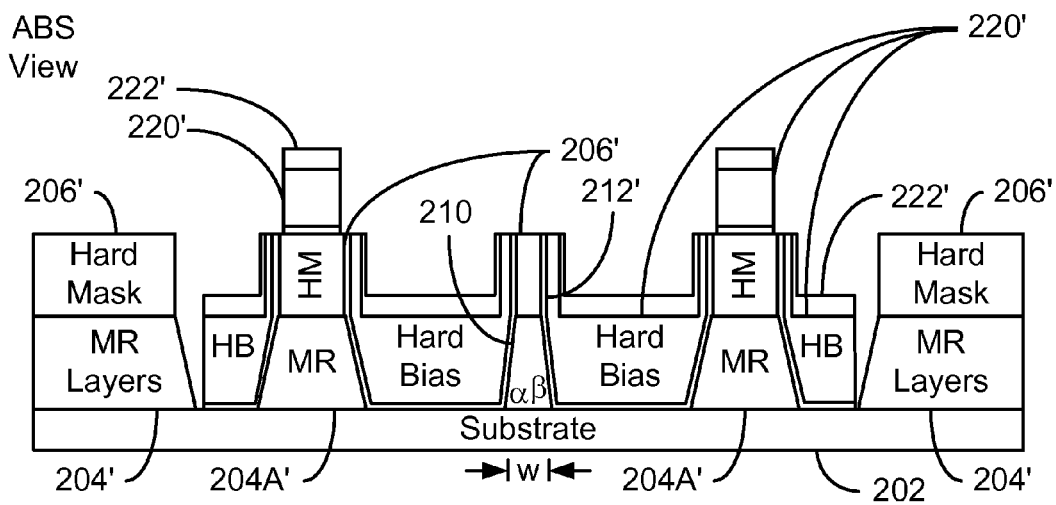

The device region mask is removed after the exposed portion of the hard bias material(s) 220' have been removed, via step 172. Step 172 may include stripping the photoresist mask 230. FIG. 13 depicts the transducer 200 after step 172 is performed. Thus, the device region of the transducer 200 is exposed.

Figure 14:
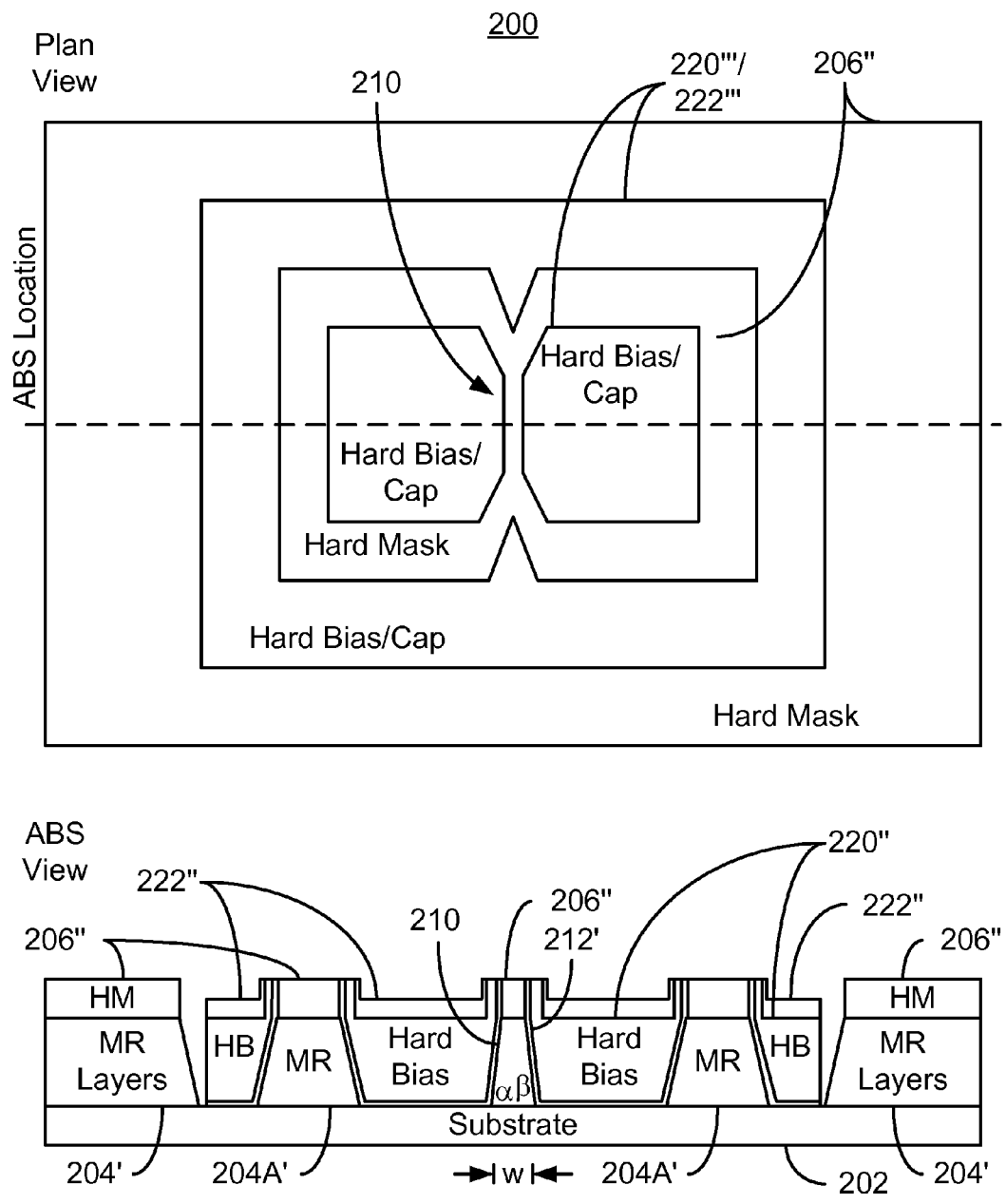

A chemical mechanical planarization (CMP) is performed to remove a portion of the material(s) residing on the hard mask, via step 174. Thus, portions of the hard bias material(s) 220' that protrude from the transducer 200 are removed. As a result, the hard mask 206' is exposed, and may be removed. FIG. 14 depicts the transducer 200 after step 174 is performed. Thus, the hard mask 206" has been thinned and is exposed. The protruding portions of the hard bias 220' have been removed. The hard bias material(s) 220" and capping layer(s) 222" remain.

Figure 15:
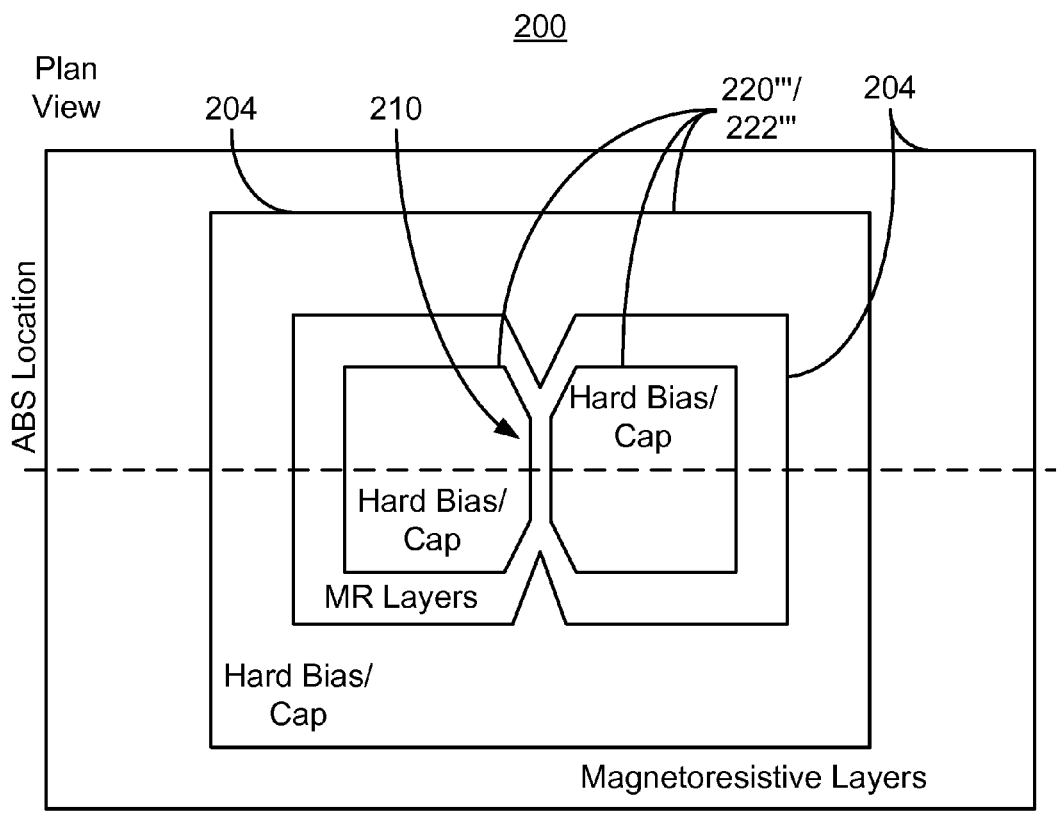
Figure 15:
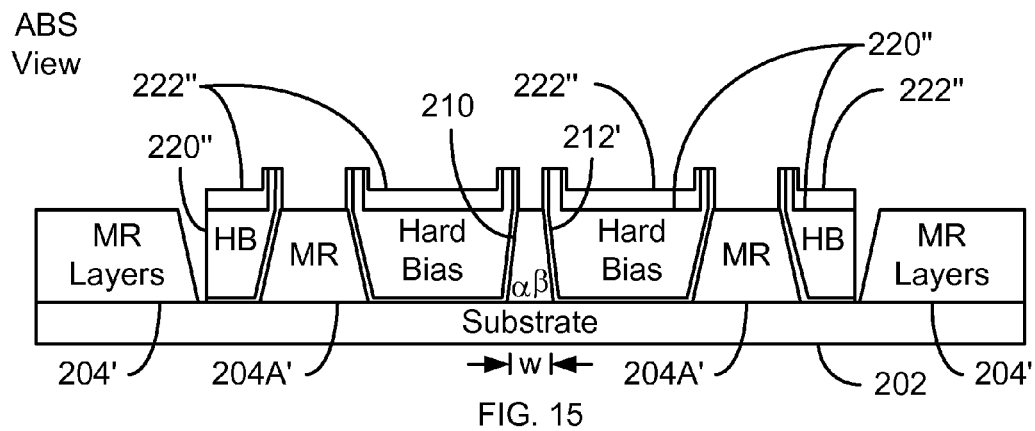

The hard mask 206" is removed, via step 176. In one embodiment, step 176 includes performing a RIE to remove the hard mask 206". For example, if a DLC hard mask 206''' is used, step 176 may include performing an oxygen RIE. FIG. 15 depicts the transducer 200 after step 176 is performed. Thus, MR layers 204A' that reside under the line portion of the hard mask 206' are exposed.

Figure 16:
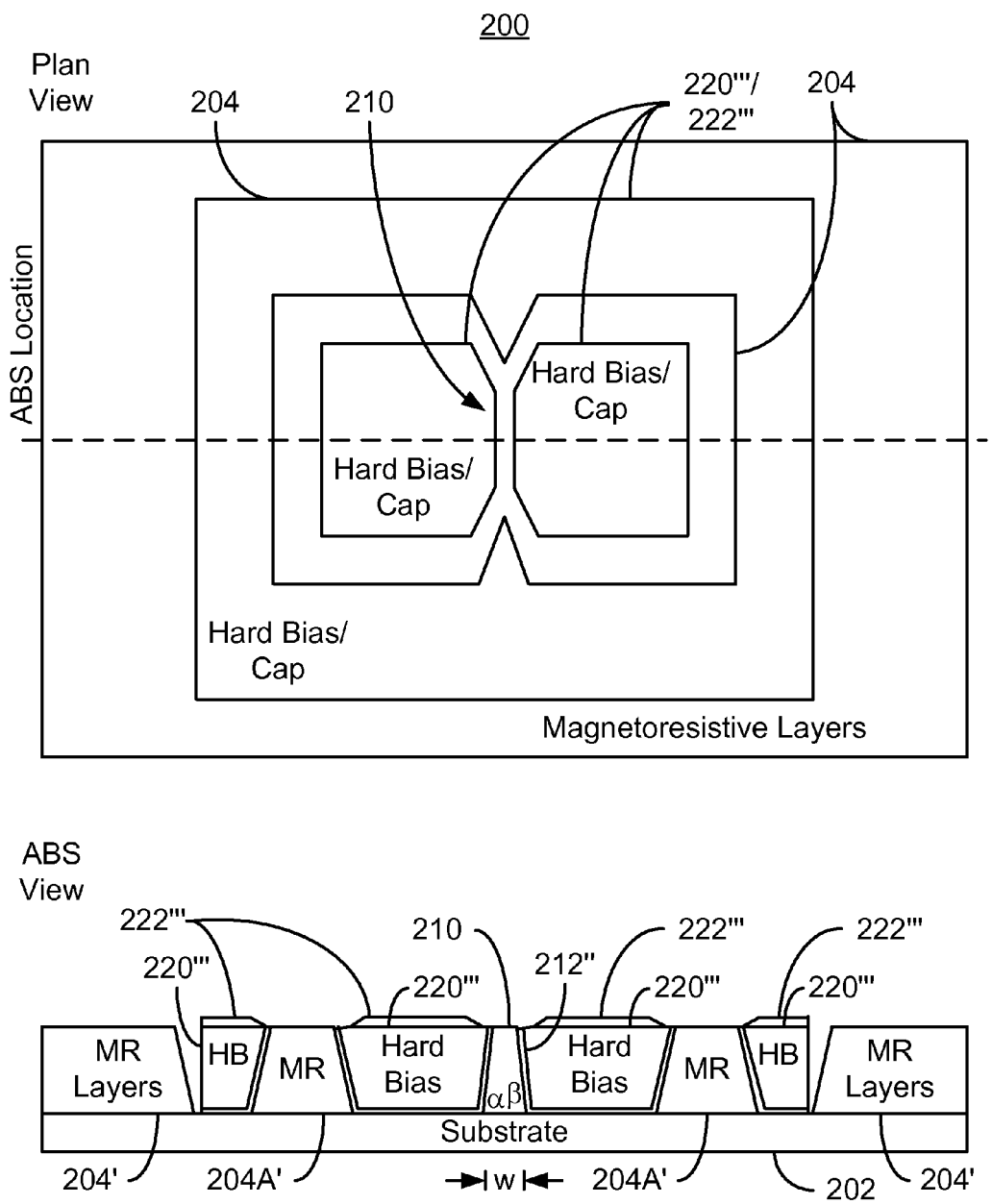

A second CMP may be performed after the step of performing the RIE is completed, via step 178. Thus, the topology of the transducer 200 may be further smoothed. FIG. 16 depicts the transducer 200 after step 178. Thus, hard bias structures 220''' and capping layers 222''' are shown. Thus, through step 174-178, the remaining hard mask has been removed.

Using the method 150, the transducer 200 may be formed. As discussed above, the transducer 200 is symmetric. Thus, the junction angles α and β may be closer is size. In particular, the average difference in junction angles α and β may be not more than six degrees. In some embodiments, average junction angle differences of four degrees or less may be fabricated. In other embodiments, average junction angle differences of four degrees or less may be fabricated. In another embodiment, the average junction angle difference is not more than three degrees. In yet another embodiment, the average junction angle difference is not more than two degrees. Further, asymmetries in the thicknesses of the hard bias structures 220''' to the left and right of the magnetoresistive structure 210 may be reduced. Consequently, asymmetries in the transducer 200 may be reduced. This may be achieved for a magnetoresistive structure 210 having a smaller track width. For example, the track width, w, is less than one hundred nanometers. In some embodiments, the track width may be thirty to forty nanometers or less. In addition, because a line frame is used, removal of the hard bias 220' may be facilitated. Thus, performance of the transducer 200 and yield using the method 150 may be improved.

We claim:

1. A magnetic recording transducer comprising:
   a magnetoresistive sensor having an left side, a right side opposite to the left side, a left junction angle at the left side, a right junction angle at the right side, and a track width, the right junction angle and the left junction angle being characterized by a junction angle difference, the junction angle difference being not more than six degrees, the track width being less than one hundred nanometers;
   a left hard bias structure residing adjacent to the left side of the magnetoresistive sensor; and
   a right hard bias structure residing adjacent to the right side of the magnetoresistive sensor.

2. The magnetic recording transducer of claim 1 wherein the junction angle difference is not more than four degrees.

3. The magnetic recording transducer of claim 1 wherein the junction angle difference is not more than three degrees.

4. The magnetic recording transducer of claim 1 wherein the junction angle difference is not more than two degrees.

5. A disk drive comprising:
   a slider;
   a magnetic recording head coupled to the slider, the magnetic recording head including a magnetic recording transducer having a magnetoresistive sensor, the magnetoresistive sensor having a left side, a right side opposite to the left side, a left junction angle at the left side, a right junction angle at the right side, and a track width, the left junction angle and the right junction angle being characterized by a junction angle difference, the junction angle difference being not more than six degrees, the track width being less than one hundred nanometers.

6. The disk drive of claim 5 wherein the junction angle difference is not more than four degrees.

7. The disk drive of claim 5 wherein the junction angle difference is not more than three degrees.

8. The disk drive of claim 5 wherein the junction angle difference is not more than two degrees.

* * * * *